Figure 1:
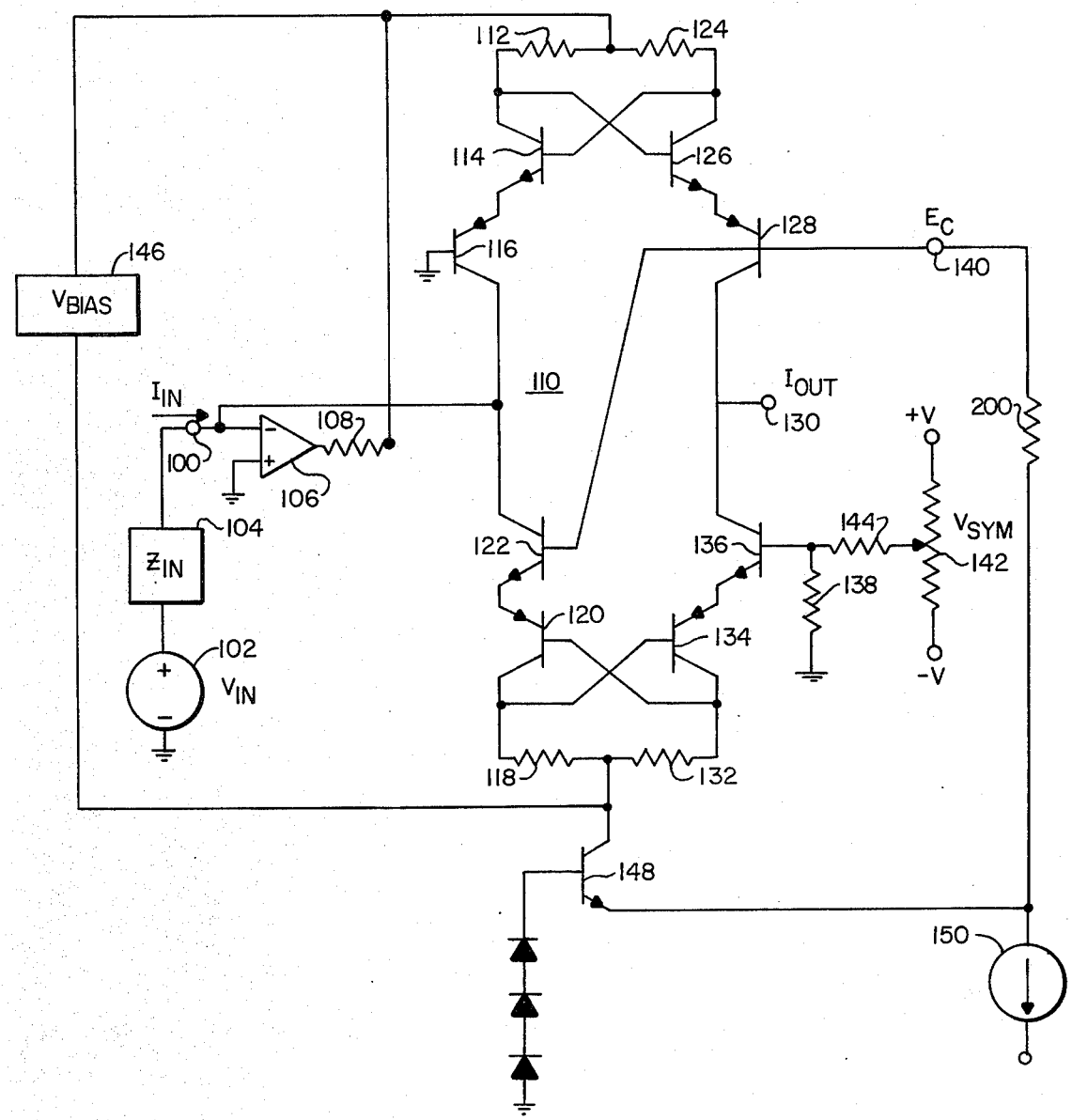

United States Patent [19]

Welland

[11] 4,434,380
[45] Feb. 28, 1984

[54] COMPENSATION FOR VCA OP AMP ERRORS

[75] Inventor: David R. Welland, Boston, Mass.
[73] Assignee: dbx, Inc., Newton, Mass.
[21] Appl. No.: 316,754
[22] Filed: Oct. 30, 1981
[51] Int. Cl.³ .......................... G06G 7/26; G06G 7/24
[52] U.S. Cl. .................................. 307/491; 307/492; 328/145
[58] Field of Search ................ 307/490, 494; 328/145, 328/144, 161

[56] References Cited

U.S. PATENT DOCUMENTS

| | | | |
|---|---|---|---|
| 3,532,868 | 10/1970 | Embley | 328/145 |
| 3,714,462 | 1/1973 | Blackmen | 307/492 |
| 4,234,804 | 11/1980 | Bergstrom | 328/145 |
| 4,341,962 | 7/1982 | Buff | 307/492 |

Primary Examiner—Stanley D. Miller
Assistant Examiner—B. P. Davis
Attorney, Agent, or Firm—Schiller & Pandiscio

[57] ABSTRACT

An improved multiplier circuit of the type including an input operational amplifier and a gain cell is disclosed. The gain cell is connected to the amplifier such that a first signal can be generated in response to and as a logarithmic function of an input signal, a control signal can be added to the first signal and a second signal can be algebraically generated as an antilogarithmic function of the algebraic sum of the first and control signals. The improvement includes means for providing a correcting signal as a function of the control signal at the output of the input amplifier substantially equal and opposite to signals produced at the output of the input amplifier by changes in the control signal.

7 Claims, 2 Drawing Figures

COMPENSATION FOR VCA OP AMP ERRORS

The present invention relates generally to analog signal multipliers or signal gain control systems, and more particularly, to voltage control amplifiers in which compensation is provided for substantially correcting for errors due to amplification of error signals produced by relatively fast changes in control signal levels.

Many systems, especially those processing audio or video signals, include signal gain control circuits controlled responsively by an electrical command or control signal. Signal gain control circuits which have been commercially successful include the multiplier circuit of the type described and claimed in U.S. Pat. No. 3,714,462 issued to David E. Blackmer on Jan. 30, 1973, as well as certain circuits manufactured and licensed by DBX, Inc., a corporation of Massachusetts (the circuits being collectively hereinafter referred to as the "DBX Multiplier Circuit"). The DBX multiplier circuit generally includes means for providing a first signal as a function of the logarithm of the input signal to the circuit and means for algebraically summing a control signal to the first signal. The level of the signal gain is a function of the control signal. The circuit also includes means for providing an output signal as a function of the antilogarithm of the algebraic sum of the first and control signals. The DBX multiplier circuit is "bipolar" meaning that the input signal can be of either or both positive and negative polarities. The "gain" provided by the circuit can be either amplification or attenuation.

The preferred DBX multiplier circuit includes an operational amplifier and a gain cell. The gain cell includes at least two transistors, each exhibiting a log-linear base-emitter voltage/collector current (Vbe/Ic) transfer characteristic, respectively connected in oppositely conductive feedback paths of the amplifier. The two transistors respectively provide the log signals in response to input signals of positive and negative polarities. The gain cell also includes at least two other transistors, also exhibiting log-linear Vbe/Ic transfer characteristics, respectively connected to the log signal converting transistors. These two other transistors respectively provide output signals as a function of the antilogarithm of the algebraic sum of the log and control signals. The gain of the transistors is preferably controllable in accordance with a control voltage applied to the bases of selected ones of the transistors.

The preferred gain cell of the DBX multiplier circuit utilizes at least two transistors of a PNP conductivity type for one polarity of input signal and at least two transistors of an NPN conductivity type for the opposite polarity input signals.

A problem encountered with certain types of circuits of the DBX Multiplier type, is that certain errors are generated with relatively quick changes in the control signal. For example, where the operational amplifier of the DBX Multiplier Circuit is of the type producing a voltage output, since the gain cell is connected to the output of the amplifier, a sudden increase in the control voltage applied to the gain cell will produce a sudden increase in voltage of the output level of the amplifier. Since the gain cell in part provides a feedback path with the amplifier, and since all amplifiers have finite voltage gains, the sudden increase in the output voltage level of the amplifier will in turn produce an increase in the input voltage level of the amplifier. An impedance provided at the input of the amplifier will discharge this error signal. However, the discharge of the error signal is typically too slow, resulting in an error current signal at the input of the amplifier. The error signal is amplified by the gain cell and produces an output error current signal of the circuit. For audio applications, this output error current signal produces a "thumping" noise.

It is an object of the present invention to provide an improved multiplier circuit which substantially overcomes or reduces the above-noted problems of the prior art.

Another object of the present invention is to provide an improved multiplier circuit in which compensation is provided for errors generated responsively to rapid changes in the control signal level.

Still another object of the present invention is to provide an improved multiplier circuit of the type including an input operational amplifier and a gain cell in which error signals generated by the amplifier responsively to changes in the gain control signal level and amplified by the gain cell are substantially reduced or eliminated.

These and other objects are achieved by an improved multiplier circuit of the type including an input operational amplifier and a gain cell. The gain cell is connected to the operational amplifier such that a first signal can be generated in response to an input signal as a function of the logarithm of the input signal, a control signal can be algebraically added to the first signal, and a second signal can be generated as a function of the algebraic sum of the first and control signals. The improvement includes means for producing a correction signal at the output of the operational amplifier. The correction signal is a function of the control signal lever and is substantially equal and opposite to signals produced by relatively rapid changes in the control signal at the output of the operational amplifier.

Other objects of the invention will in part be obvious and will in part appear hereinafter. The invention accordingly comprises the apparatus possessing the construction, combination of elements, and arrangement of parts which are exemplified in the following detailed disclosure, and the scope of the application of which will be indicated in the claims.

Figure 2:
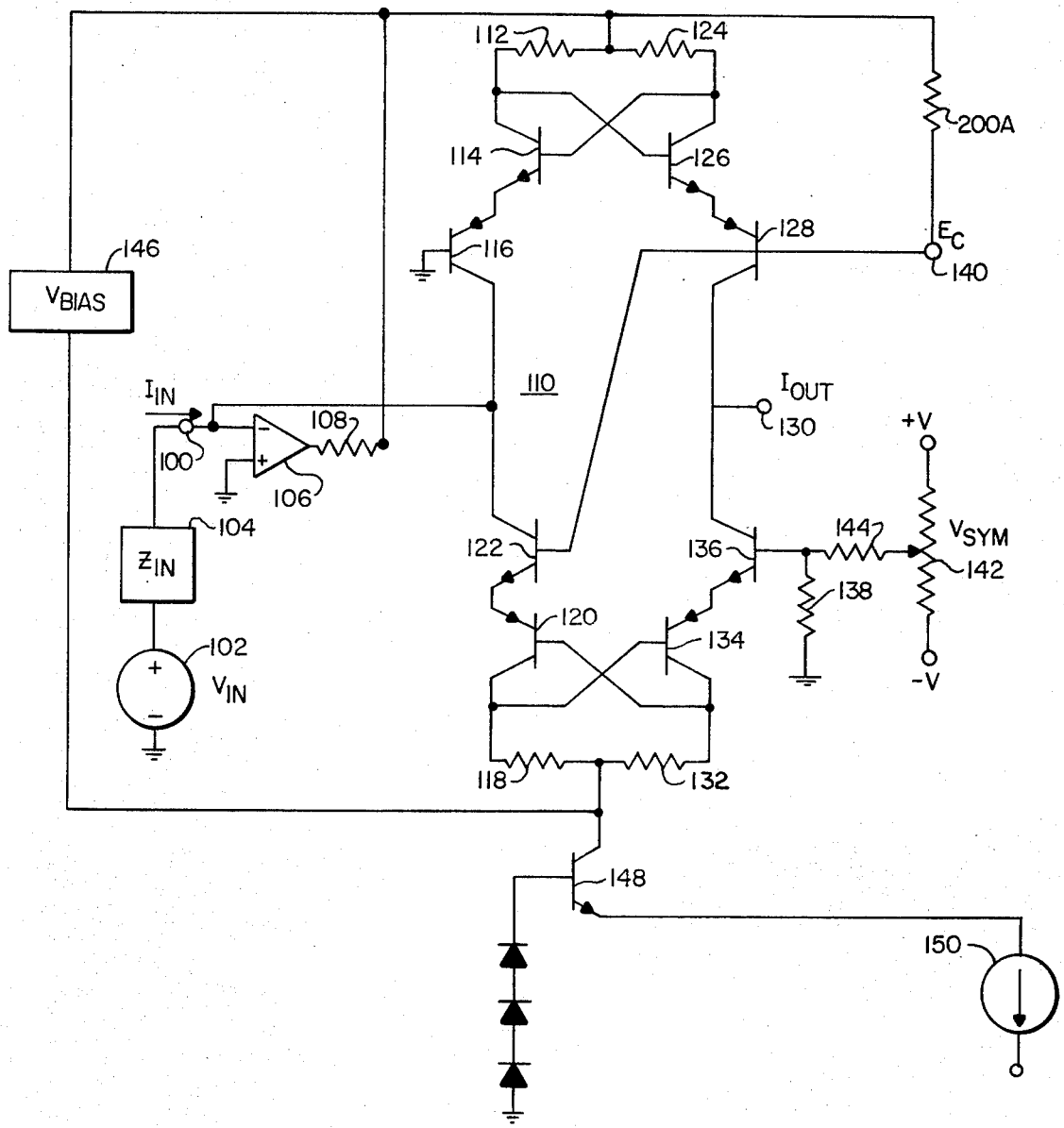

For a fuller understanding of the nature and objects of the present invention, reference should be had to the following detailed description taken in connection with the accompanying drawing wherein:

FIG. 1 is a schematic circuit diagram of the preferred embodiment of the present invention; and FIG. 2 is a schematic circuit diagram of an alternative embodiment of the present invention.

In the drawings the same numerals are used to refer to like parts.

In FIG. 1, a typical multiplier circuit of the DBX type is shown incorporating the present invention. The multiplier circuit includes an input terminal 100 for receiving the input current signal Iin of either or both polarities. The input current Iin is generated by the input voltage Vin from voltage source 102 (such as a source of audio or video signals) applied across the input impedance load 104. Input terminal 100 is connected to the inverting input of an input operational amplifier 106, the latter having its non-inverting input connected to system ground. Generally, amplifier 106 is of the type which has some finite output admittance or has its output connected to resistor 108. The output of amplifier 106 is connected to its inverting input through two feedback paths, one for each polarity of input signal. Each feedback path includes the base-emitter junctions of two log transistors of the eight transistor gain cell 110. More particularly, the output of amplifier 106 is connected through resistor 108 to resistor 112, which in turn is connected to the collector of NPN log transistor 114 of cell 110. The emitter of log transistor 114 is connected to the emitter of PNP log transistor 116 of cell 110, which in turn has its collector connected to the input terminal 100 so as to form the first feedback path. In a similar manner the output of amplifier 106 is connected through resistor 108 to the voltage bias source 146 to resistor 118. Resistor 118 in turn is connected to the collector of PNP log transistor 120 of cell 110. The emitter of log transistor 120 is connected to the emitter of NPN log transistor 122 of cell 110. the collector of log transistor 122 is connected to the input terminal 100 so as to form the second feedback path.

The cell 110 also includes antilog signal conversion means for each polarity of input signal. In particular, the junction of resistors 108 and 112 is connected to resistor 124, which in turn is connected to the collector of NPN antilog transistor 126 of cell 110. The emitter of antilog transistor 126 is connected to the emitter of PNP antilog transistor 128 of cell 110. The collector of antilog transistor 128 is connected to the output terminal 130 of the circuit. In a similar manner the junction of bias source 146 and resistor 118 is connected through resistor 132 to the collector of PNP antilog transistor 134 of cell 110. The emitter of antilog transistor 134 is connected to the emitter of NPN antilog transistor 136 of cell 110. The collector of transistor 136 is connected to output terminal 130. The base and collector of log transistor 114 is coupled respectively to the collector and base of antilog transistor 126. Similarly the base and collector of transistor 120 is coupled respectively to the collector and base of antilog transistor 134. The base of log transistor 116 is connected to system ground, while the base of antilog transistor 136 is connected to system ground through resistor 138. Log transistors 114 and 116, resistors 112 and 124 and antilog transistors 126 and 128 thus form one signal processing path for one polarity of input signal, while log transistors 120 and 122, resistors 118 and 132, and antilog transistors 134 and 136 form the second signal processing path for the other polarity of input signal. The bases of transistors 122 and 128 are tied together and to the control signal (Ec) input terminal 140. Where mismatches occur between transistors 114, 116, 126, and 128 on the one hand, and transistors 120, 122, 134 and 136 on the other hand, gain symmetry is provided by adjusting the adjustable potentiometer 142 (which is suitably biased by a voltage potential) which is connected to the base of transistor 136 through resistor 144. The cell 110 is suitably biased with voltage bias source 146 connected between the junction formed by resistors 112 and 124 and the junction formed by resistors 118 and 132. The bias source may be a D.C. battery, or alternatively, a voltage source such as the one disclosed for an eight transistor gain cell (such as cell 110) in the copending application U.S. Ser. No. 247,648 filed Mar. 26, 1981 by David E. Blackmer and me (and assigned to the present assignee). A source of constant current is connected to the junction of resistors 118 and 132 of cell 110. Preferably, the junction of resistors 118 and 132 is connected to the collector of NPN transistor 148, which in turn has its emitter connected to a source 150 of constant current, and its base connected three diode drops above system ground.

To the extent described, the system is essentially the same as that described in U.S. Pat. No. 3,714,462, and copending application U.S. Ser. No. 247,648. The input signal is applied to input terminal 100, while the control signal Ec is applied to control signal input terminal 140. For negative input signals at terminal 100, the upper signal processing path is conductive wherein transistors 114 and 116 provide a voltage signal as a logarithmic function of the input current signal.

The control signal at terminal 140 is applied to the base of transistor 128. Antilog transistors 126 and 128 subsequently provide an output current signal at output terminal 130, which signal is an antilogarithmic function of the combined log signal and control signal.

In a similar manner, a positive input signal at input terminal 100 results in the bottom half of cell 110 becoming conductive. Transistors 120 and 122 provide a log voltage signal as a logarithmic function of the input current signal. The control signal is algebraically added to the log signal by being applied to the base of transistor 122. The antilog transistors 134 and 136 provide an output current signal as a function of the antilogrithm of the algebraic sum of the log signal and control signal.

In operation, the circuit operates in the desired manner when the control signal level remains substantially unchanged or changes slowly. However, at least for audio applications, a sudden change in the level of the control signal which produces a rapid change in gain can produce a "thumping noise." I have determined that the thumping noise occurs due to a rapid change in the voltage at the output of amplifier 106 responsively to rapid changes in the control signal. This rapid change in the output voltage level of amplifier 106 in turn produces a rapid change at the inverting input of amplifier 106. This voltage error at the input appears across the input impedance 104 and is processed as a portion of the input current Iin signal thereby producing an error.

This problem can be illustrated by the following example. If a sudden change in the control signal at terminal 140 occurs, (e.g., a change from 0 to −240 mV which generates a gain of 100) a resulting change of one-half that magnitude (i.e., −120 mV) is produced at the junction of resistors 112 and 124. This change in voltage at the junction of resistors 112 and 124 will in turn produce an ewual change on the opposite side of resistor 108 at the output of amplifier 106 since a constant current is provided through resistor 108 in the absence of an input signal (due to the voltage bias source 146 and current source 150).

The change of voltage at the output of amplifier 106 will provide a change of voltage at the inverting input of amplifier 106. This error voltage at the inverting input of amplifier 106 will produce an error current through the input impedance 104 of the system. Gain cell 110 will amplify the error current by whatever gain is set producing an error signal at the output terminal 130. Eventually, this error voltage at the input 100 of amplifier 106 will discharge through an RC network (not shown) typically provided at the input of the amplifier 106. However, such discharge does not prevent the initial error signal amplification.

According to the present invention, means are provided for substantially cancelling the change in voltage at the junction of the output of amplifier 106 can resistor 108 which would otherwise be produced in response to a sudden change in the level of the control signal at terminal 140. In the preferred embodiment, the cancellation of this change in voltage at the junction of the output of amplifier 106 and resistor 108 is accomplished by simultaneously generating a current through resistor 108 which produces a voltage drop across resistor 108 equal and opposite to the change in voltage generated by the change in control signal level.

More particularly, when the change in the control voltage level at terminal 140 equals Ec, the change in voltage at the junction of resistors 112 and 124 is Ec/2. To generate a cancelling correction voltage across resistor 108, an additional correction current should be generated through resistor 108 equal to Ec/(2·R108), wheren R108 is the reistance value of resistor 108.

Referring to FIG. 1 this additional correction current Ec/(2·R108) can be easily provided by connecting a correction resistor 200 (having a resistance value equal to twice R108) between terminal 140 and the source 150 of constant current. When a change in voltage Ec at terminal 140 occurs, an additional correction current is generated through resistor 200 equal to Ec/2·R108). An equal current will be generated in response to this current through resistor 108 so as to provide the necessary correction. By providing the necessary correction current through the resistor 108, the error voltage is cancelled.

It should be appreciated that alternatively, a correction resistor 200A, shown in FIG. 2 can be connected between terminal 140 and the junction of resistors 112 and 124. Since the change in voltage at the junction of resistors 112 and 124 is equal to Ec/2, the additional current which is necessary to add through resistor 108 is Ec/(2·R200A), wherein R200A is the resistance value of resistor 200A and necessarily equals R108.

It will appreciated that the present invention provides the correction voltage at the output of amplifier 106. So long as amplifier 106 produces a voltage output in response to some input (whether current or voltage) it must have some finite output impedance or a resistor, such as resistor 108, at the output, in order to require the change in current across the finite impedance or resistor so as to maintain the voltage output constant.

It should further be appreciated that the present invention can be used with other multiplier circuits having different gain cells, such as the four transistor gain cell shown in U.S. Pat. No. 3,714,462.

Since certain changes may be made in the above apparatus without departing from the scope of the invention herein involved, it is intended that all matter contained in the above description or shown in the accompanying drawing shall be interpreted in an illustrative and not in a limiting sense.

What is claimed is:

1. A multiplier circuit of the type comprising (1) an input amplifier, said amplifier providing a finite signal gain and having (a) an input terminal for receiving an input signal and (b) an output terminal and (2) a gain cell connected to the output of said amplifier, said gain cell including (A) means for generating a first signal in response to and as a logarithmic function of said input signal (B) means for algebraically adding a control signal to said first signal, and (C) means for generating a second signal as an antilogarithmic function of the algebraic sum of the first and control signals, wherein the improvement comprises:

means for generating a correcting signal in response to and as a function of the control signal at the output terminal of said input amplifier substantially equal and opposite to signals generated at the output of said amplifier in response to changes in said control signal.

2. A multiplier circuit according to claim 1, wherein said amplifier generates a voltage signal at said output terminal in response to said input signal, and said means for generating said correction signal includes means for generating a correction voltage at said output terminal at a level equal to one half the change in said control signal.

3. A multiplier circuit according to claim 2, further including first impedance means disposed at said output terminal, wherein said means for generating said correction signal includes means responsive to said control signal for generating a correction current through said impedance means so as to generate a correction voltage across said impedance means.

4. A multiplier circuit according to claim 3 further including a control signal input terminal for receiving said control signal as a voltage signal, and means coupled to said gain cell for generating a substantially constant current for providing a biasing current through said gain cell, said means for generating said correction current including second impedance means coupled between said control signal input terminal and said means for generating said substantially constant current.

5. A multiplier circuit according to claim 4 wherein said first impedance means includes a first resistor coupled to said output terminal of said amplifier and said second impedance means includes a second resistor having substantially twice the resistance value of said first resistor.

6. A multiplier circuit according to claim 3, further including a control signal input terminal for receiving said control signal as a voltage signal, and wherein said means for generating said correction current includes second impedance means coupled between said control signal input terminal and said first impedance means.

7. A multiplier circuit according to claim 6, wherein said first impedance means includes a first resistor coupled to the output of said amplifier and said second impedance means includes a second resistor having substantially the same resistance value as said first resistor.

* * * * *